(12) United States Patent
Shen et al.

(10) Patent No.: US 12,532,678 B2
(45) Date of Patent: Jan. 20, 2026

(54) METHOD FOR MANUFACTURING SEMICONDUCTOR STRUCTURE AND SEMICONDUCTOR STRUCTURE THEREOF

(71) Applicant: TAIWAN SEMICONDUCTOR MANUFACTURING COMPANY LTD., Hsinchu (TW)

(72) Inventors: Yu-Chun Shen, Tainan (TW); Chi-Chung Jen, Kaohsiung (TW); Kai-Hung Hsiao, Kaohsiung (TW); Szu-Hsien Lee, Kaohsiung (TW); Wen-Chih Chiang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 312 days.

(21) Appl. No.: 18/304,326

(22) Filed: Apr. 20, 2023

(65) Prior Publication Data
US 2024/0355630 A1    Oct. 24, 2024

(51) Int. Cl.
*H01L 21/3065* (2006.01)
*H01L 21/033* (2006.01)

(52) U.S. Cl.
CPC ...... *H01L 21/3065* (2013.01); *H01L 21/0337* (2013.01)

(58) Field of Classification Search
None
See application file for complete search history.

(56) References Cited

U.S. PATENT DOCUMENTS

| | | | |
|---|---|---|---|
| 2021/0375988 A1* | 12/2021 | Ko | H10N 50/01 |
| 2022/0020917 A1* | 1/2022 | Chang | H10N 50/85 |
| 2022/0069107 A1* | 3/2022 | Han | H10D 84/038 |

* cited by examiner

*Primary Examiner* — Binh X Tran
(74) *Attorney, Agent, or Firm* — WPAT LAW; Anthony King

(57) ABSTRACT

A semiconductor structure including a pillar structure and a spacer structure is provided. The pillar structure is disposed over a substrate, and comprises: a lower layer, disposed on the substrate; an upper layer, disposed over the lower layer; and a dielectric layer, disposed between the lower layer and the upper layer, wherein the upper layer includes a first portion and a second portion disposed below and connecting the first portion. The spacer structure laterally surrounds the pillar structure, and comprises: an upper portion, surrounding the first portion of the upper layer; and a lower portion, disposed below and connecting the upper portion, wherein a first thickness of the upper portion is substantially greater than a second thickness of the lower portion. A method for manufacturing a semiconductor structure is also provided.

20 Claims, 19 Drawing Sheets

METHOD FOR MANUFACTURING SEMICONDUCTOR STRUCTURE AND SEMICONDUCTOR STRUCTURE THEREOF

BACKGROUND

Semiconductor devices are used in a variety of electronic applications, such as personal computers, cellular phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. As the semiconductor industry has progressed into advanced technology process nodes in pursuit of greater device density, an issue of an accuracy and integrity of material filling has arisen.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, dimensions of the various features may be arbitrarily increased or reduced for clarity of discussion.

DETAILED DESCRIPTION

Figure 1:
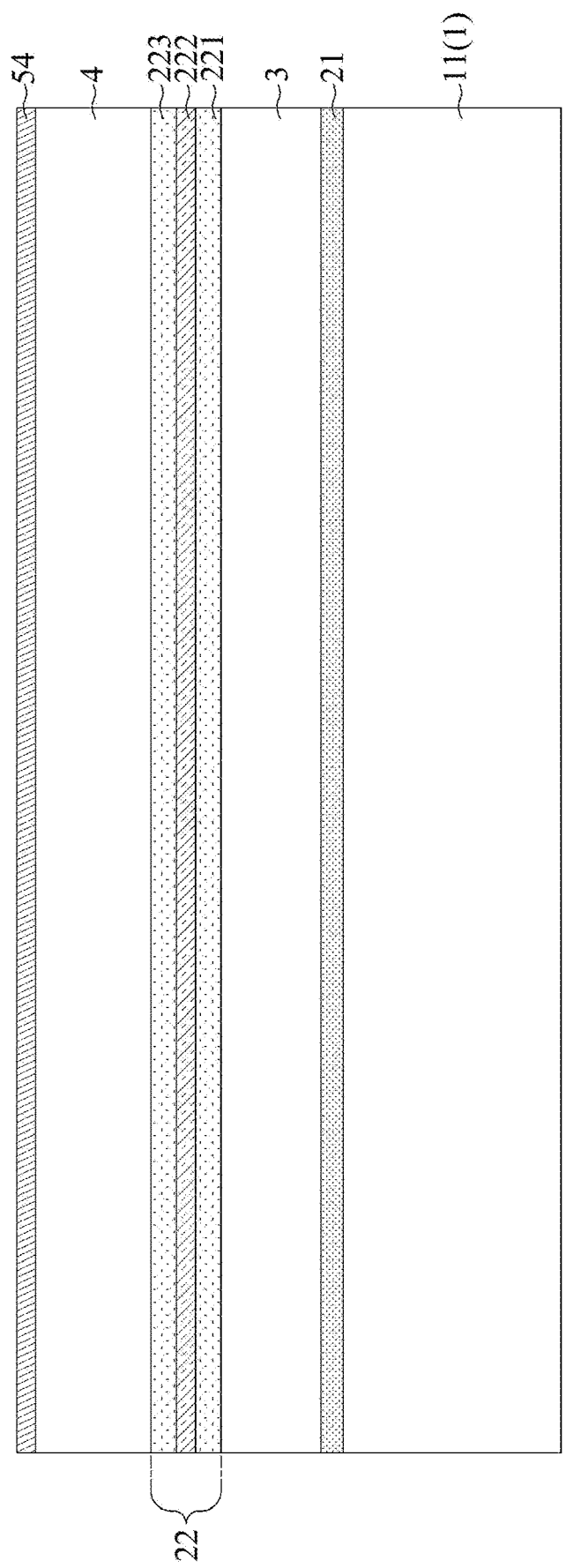
FIGS. 1 to 11 and 13 to 16 are schematic diagrams at different stages of a method for manufacturing a semiconductor structure in accordance with different embodiments of the disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

With continuing size reductions in each new generation of semiconductor devices, material filling a gap, a recess or a hole becomes difficult due to process limitations. A void formed by incomplete filling of the process can result in defect in a final structure. The present disclosure provides a method of manufacturing a semiconductor structure. The method includes an additional process to shrink a width of a head of a protrusion (or a pillar structure) so as to enlarge an opening of a gap, and a filling result can be improved, and the defect can be prevented. A product yield and product performance can be thereby improved.

FIGS. 1 to 16 are schematic diagrams at different stages of a method for forming a semiconductor structure in accordance with some embodiments of the present disclosure. For a purpose of clarity and simplicity, reference numbers of elements with same or similar functions are repeated in different embodiments. However, such usage is not intended to limit the present disclosure to specific embodiments or specific elements. In addition, conditions or parameters illustrated in different embodiments can be combined or modified to form different combinations of embodiments as long as the parameters or conditions used are not in conflict.

Referring to FIG. 1, a substrate 1 is provided, received, or formed in accordance with some embodiments of the present disclosure. In some embodiments, the substrate 1 includes a bulk semiconductor material, such as silicon. The substrate 1 may include another elementary semiconductor, such as germanium; a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In some embodiments, the substrate 1 is a semiconductor-on-insulator (SOI) substrate.

A dielectric layer 21, a lower gate layer 3, a dielectric layer 22, an upper gate layer 4, and a hard layer 54 can be sequentially formed over the substrate 1. In some embodiments, the dielectric layer 21 or 22 is formed by a deposition. In some embodiments, the dielectric layer 22 is a multi-layer structure and includes sub-layers 221, 222 and 223. The dielectric layers 21 and 22 can include a suitable dielectric material, such as silicon oxide ($SiO_x$), silicon nitride ($Si_xN_y$), silicon oxynitride (SiON), other low-k dielectric materials, high-k dielectric materials, or a combination thereof. In some embodiments, the dielectric layer 21 is a silicon oxide layer. The dielectric layer 22 can include different dielectric materials. In some embodiments, the sub-layer 221 and 223 include a same diel electric material, and the sub-layer 222 includes a dielectric layer different from that of the sub-layer 221 or 223. In some embodiments, the sub-layer 221 and 223 include oxide, and the sub-layer 222 include nitride. In some embodiments, the dielectric layer 22 is an oxide-nitride-oxide layer. In some embodiments, the sub-layer 221 and 223 include nitride, and the sub-layer 222 include oxide. In some embodiments, the dielectric layer 22 is a nitride-oxide-nitride layer.

The lower gate layer 3 and the upper gate layer 4 are configured to form a floating gate and a control gate respectively of a flash device, and one or more suitable materials (e.g., such as polysilicon, amorphous silicon, silicon germanium, or other suitable material) can be applied. In some embodiments, the lower gate layer 3 and the upper gate layer 4 include semiconductive material. In some embodiments, the lower gate layer 3 and the upper gate layer 4 include silicon. The hard layer 54 is for a purpose of protection of a pillar structure to be formed in subsequent processing. In some embodiments, the hard layer 54 includes one or more dielectric materials. In some embodiments, the hard layer 54 includes a dielectric material selected from the list of the materials of the dielectric layers 21 and 22 as illustrated above. In some embodiments, the material of the hard layer 54 is different from those of the dielectric layers 21 and 22. In some embodiments, the hard layer 54 includes silicon oxynitride. In some embodiments, a plurality of active areas 11 is formed in the substrate 1 prior to the formation of the dielectric layer 21. Only one active area 11 can be seen from the cross section shown in of FIG. 1, but the present disclosure is not limited herein.

Figure 2:
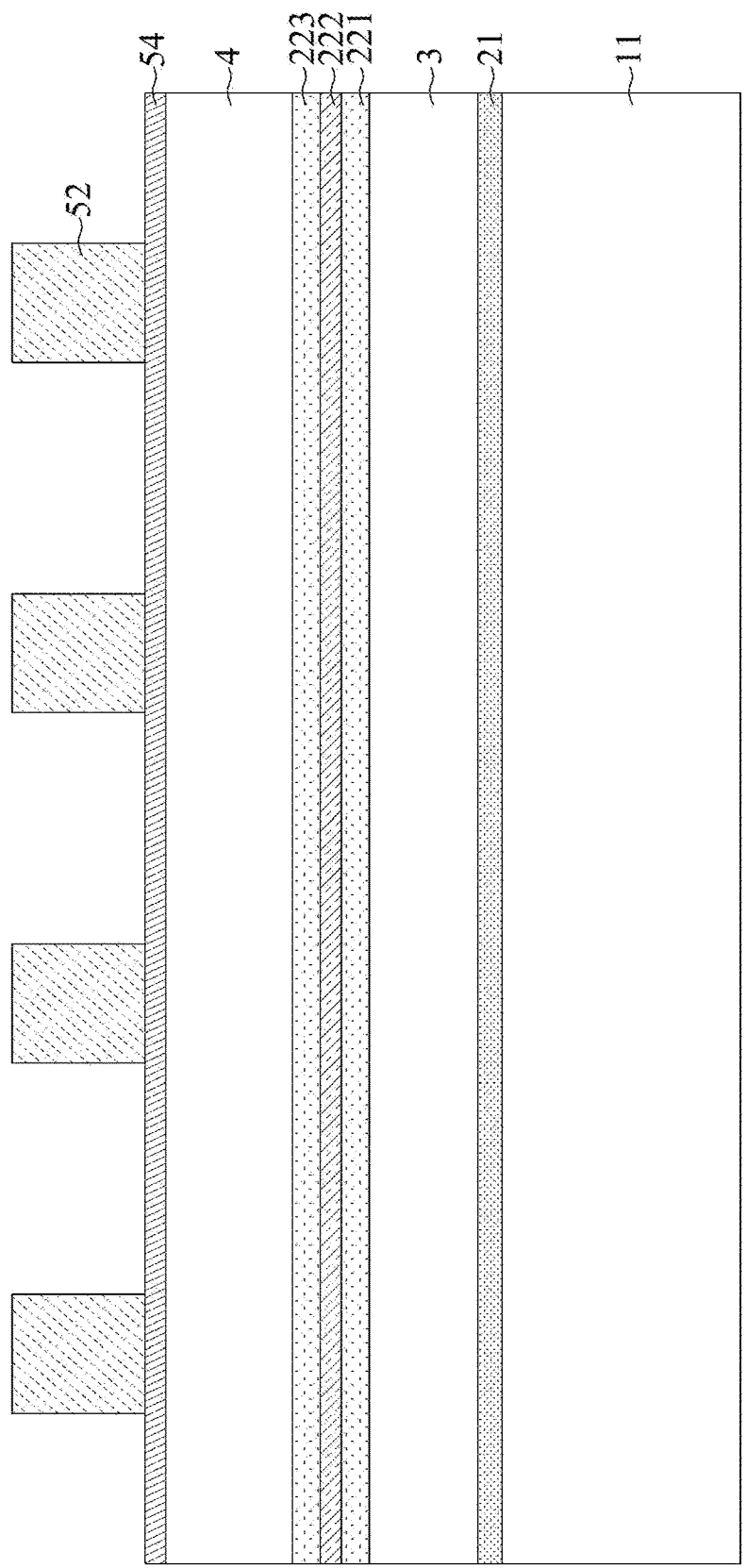

Referring to FIG. 2, a mask layer 52 is formed over the hard layer 54 in accordance with some embodiments of the present disclosure. The mask layer 52 may be for a purpose of definition of a plurality of pillar structures to be formed in subsequent processing. In some embodiments, the mask layer 52 includes a photoresist material. The photoresist material can be a positive type or a negative type depending on different applications.

Figure 3:
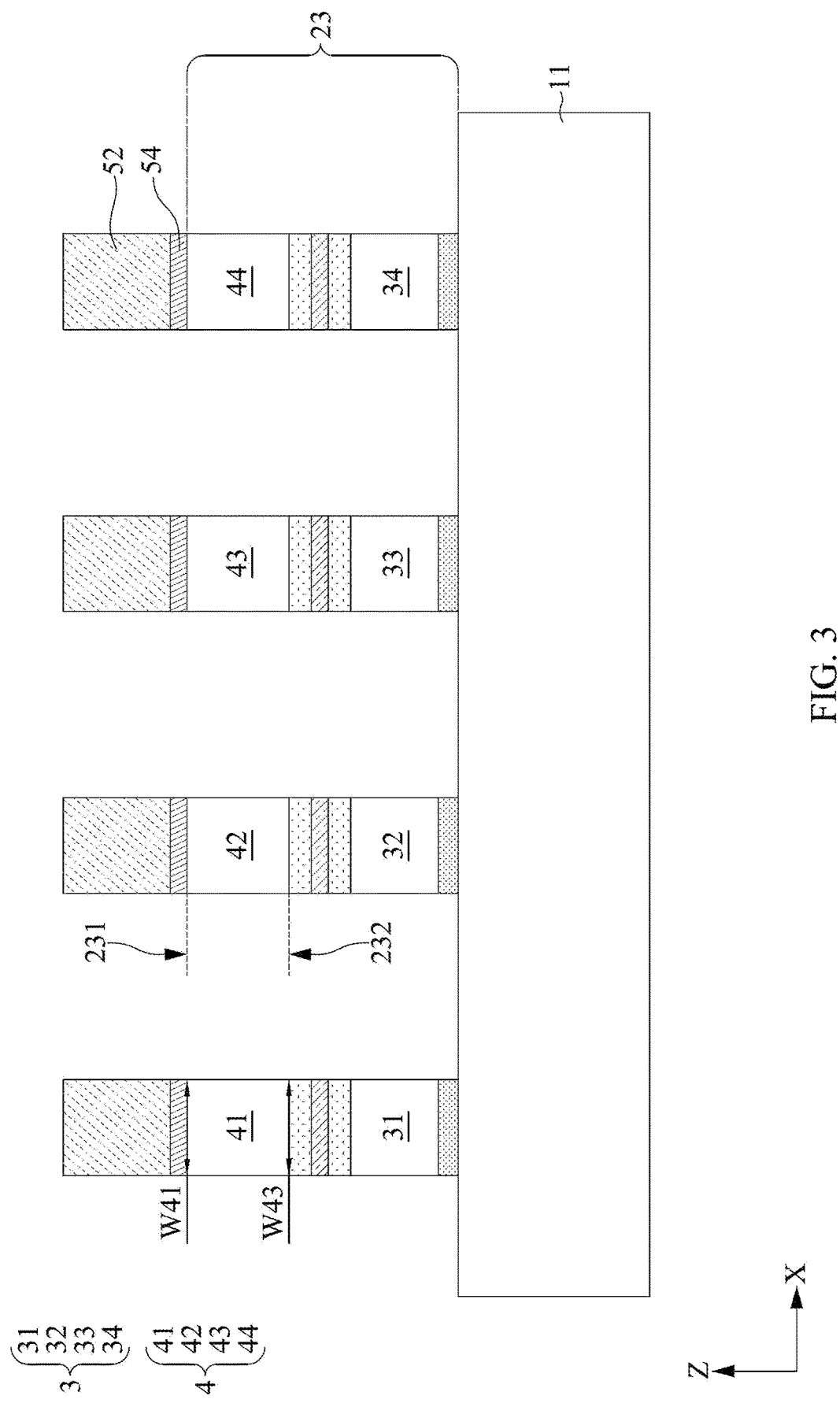

Referring to FIG. 3, the hard layer 54, the upper gate layer 4, the dielectric layer 22, the lower gate layer 3, and the dielectric layer 21 are patterned. In some embodiments, a first etching operation is performed to pattern the hard layer 54 using the mask layer 52 as a mask, and a second etching operation is performed to pattern the upper gate layer 4, the dielectric layer 22, the lower gate layer 3, and the dielectric layer 21 using the patterned hard layer 54 as a mask. In some embodiments, the mask layer 52 is removed after the first etching operation. In some embodiments, the second etching operation includes multiple steps, and the upper gate layer 4, the dielectric layer 22, the lower gate layer 3, and the dielectric layer 21 are sequentially removed by the multiple steps. In some embodiments, a non-selective etching operation is performed to remove the upper gate layer 4, the dielectric layer 22, the lower gate layer 3, and the dielectric layer 21 concurrently. In some embodiments, the mask layer 52 is removed after the patterning of the upper gate layer 4, the dielectric layer 22, the lower gate layer 3, and the dielectric layer 21.

Each of the hard layer 54, the upper gate layer 4, the dielectric layer 22, the lower gate layer 3, and the dielectric layer 21 are patterned into a plurality of segments, and a plurality of pillar structures 23 is thereby formed. In some embodiments, the upper gate layer 4 includes segments 41, 42, 43 and 44 arranged along a first direction (horizontal direction or X direction). In some embodiments, the lower gate layer 3 includes segments 31, 32, 33 and 34 arranged along the first direction and disposed below the segments 41, 42, 43 and 44 respectively. In some embodiments, widths of the segments 41, 42, 43 and 44 are substantially equal. In some embodiments, widths of the segments 31, 32, 33 and 34 are substantially equal. In some embodiments, a width of a pillar structure 23 is consistent along a second direction (vertical direction or Z direction). A width W41 of a segment 41, 42, 43 or 44 of the upper gate layer 4 measured along a top surface 231 of the upper gate layer 4 is substantially equal to a width 43 of the segment 41, 42, 43 or 44 of the upper gate layer 4 measured along a bottom surface 232 of the upper gate layer 4.

In some embodiments, the hard layer 54 is removed in subsequent processing, and the upper gate layer 4, the dielectric layer 22, the lower gate layer 3, and the dielectric layer 21 are remained in a memory unit, for instance, of a flash device. For ease of illustration, each of the pillar structures 23 includes a segment (e.g., 41, 42, 43 or 44) of the upper gate layer 4, a segment of the dielectric layer 22, a segment (e.g., 31, 32, 33 or 34) of the lower gate layer 3, and a segment of the dielectric layer 21 stacking along the second direction of the substrate 1.

Figure 4:
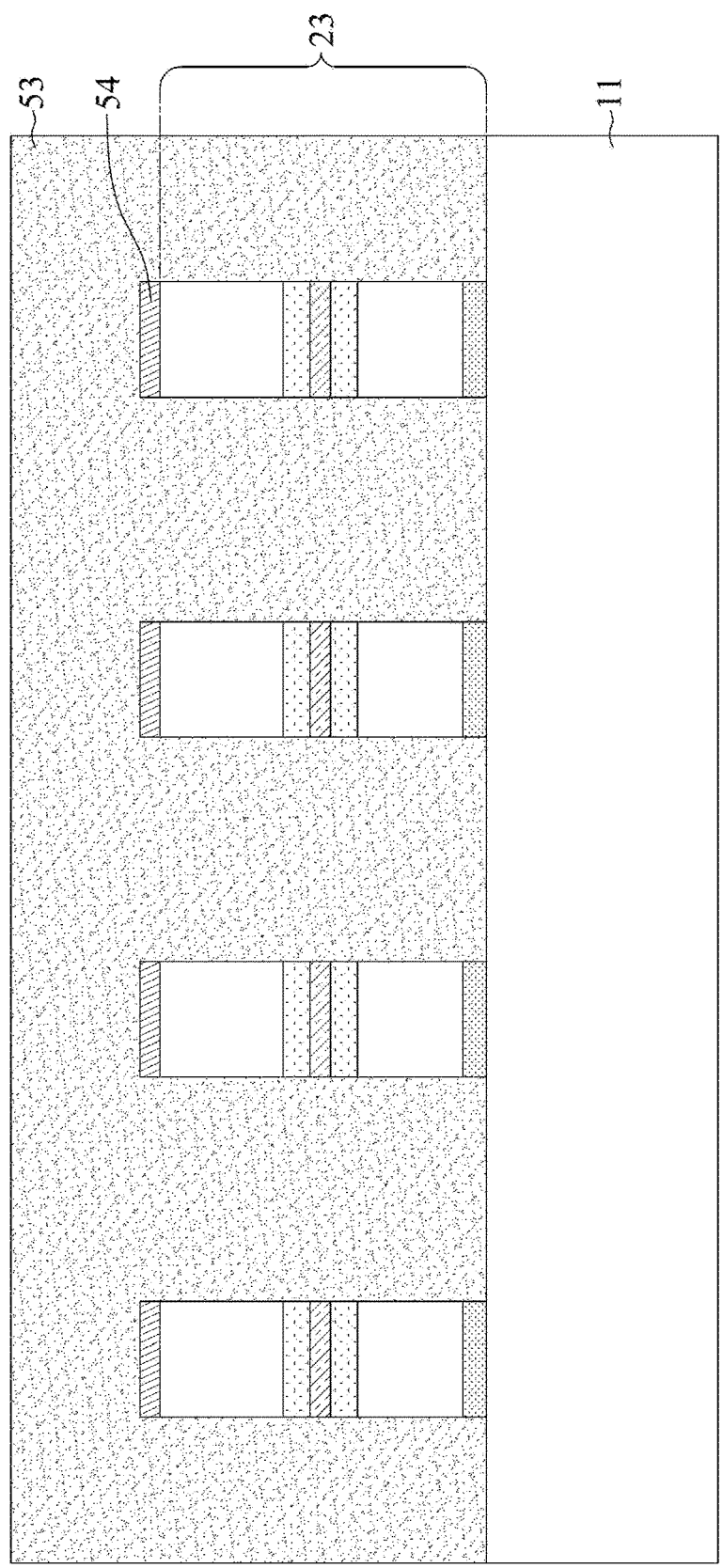

Referring to FIG. 4, a mask layer 53 is formed between the pillar structures 23 and over the hard layer 54 in accordance with some embodiments of the present disclosure. In some embodiments, the mask layer 53 includes a photoresist material. In some embodiments, the photoresist material is a positive photoresist material. However, the present disclosure is not limited herein. In alternative embodiments, the photoresist material is a negative photoresist material. In other alternative embodiments, the mask layer 53 includes another suitable material, such as a dielectric material, having an etching selectivity to the materials of the upper gate layer 4.

Figure 5:
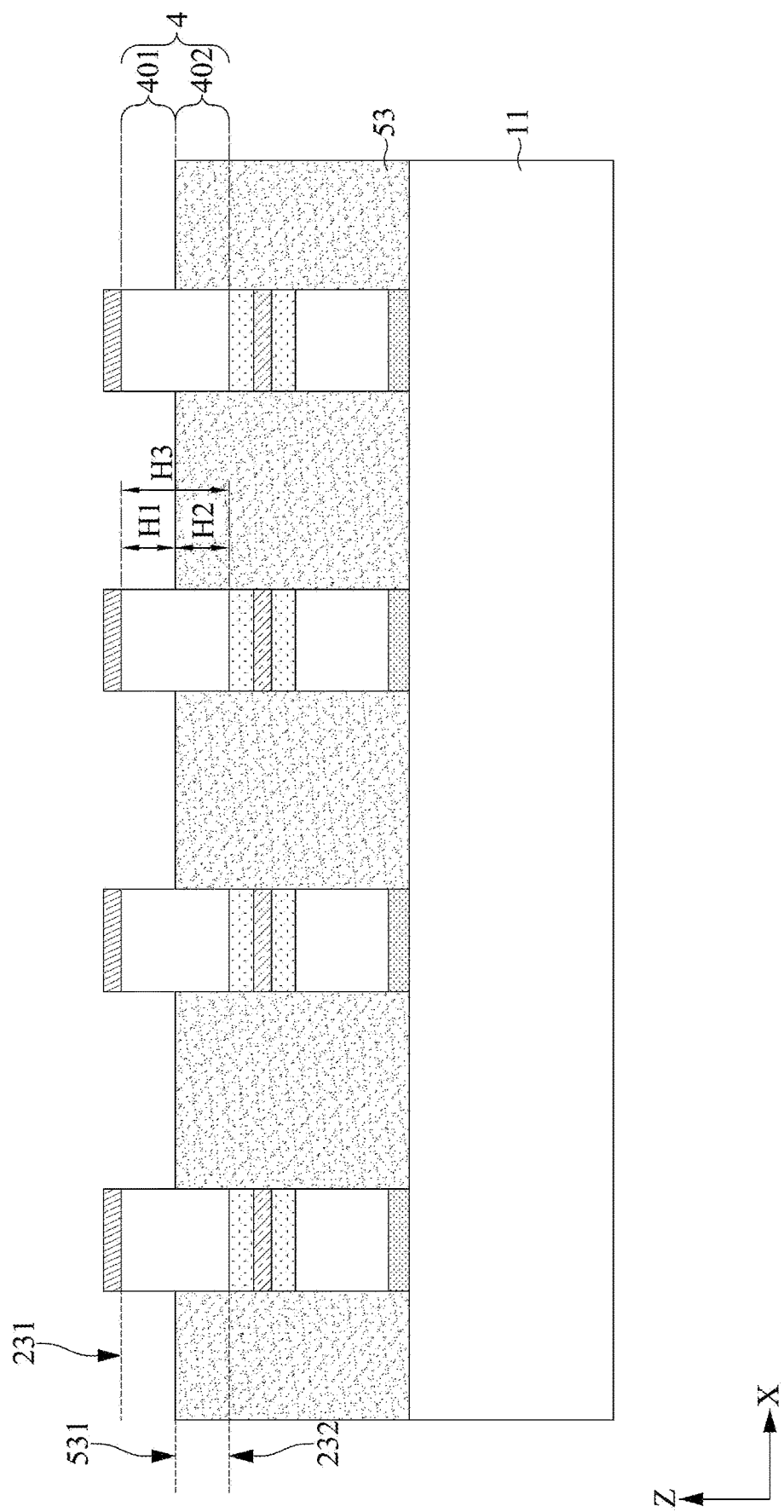

Referring to FIG. 5, a portion of the mask layer 53 is removed, and a portion of the upper gate layer 4 is exposed in accordance with some embodiments of the present disclosure. A thickness of the mask layer 53 is reduced by, for example, an etching operation having a high selectivity to the mask layer 53. In some embodiments, a portion of every segment of the upper gate layer 4 is exposed through the mask layer 53. The etching operation may stop when a top surface 531 of the mask layer 53 is below the top surface 231 of the upper gate layer 4 by a distance H1. For a purpose of illustration, the exposed portion of the upper gate layer 4 is referred to as a first portion 401, and a remaining portion of the upper gate layer 4 surrounded by the mask layer 53 after the etching operation is referred to as a second portion 402.

In some embodiments, the distance H1 is measured along the second direction (or Z direction). In some embodiments, the distance H1 is in a range of 50% to 90% of a thickness H3 of the upper gate layer 4. In some embodiments, a distance H2 of the top surface 531 of the mask layer 53 and a bottom surface 232 of the upper gate layer 4 is in a range of 10% to 50% of the thickness H3 of the upper gate layer 4. In other words, a thickness of the first portion 401 equals to the distance H1, a thickness of the second portion 402 equals to the distance H2, and a total of the distances H1 and H2 equals to the thickness H3 of the upper gate layer 4. In some embodiments, the top surface 231 of the upper gate layer 4 defines a top surface of the pillar structure 23. In some embodiments, the top surface 231 of upper gate layer 4 is referred to as the top surface 231 of the pillar structure 23.

Figure 6:
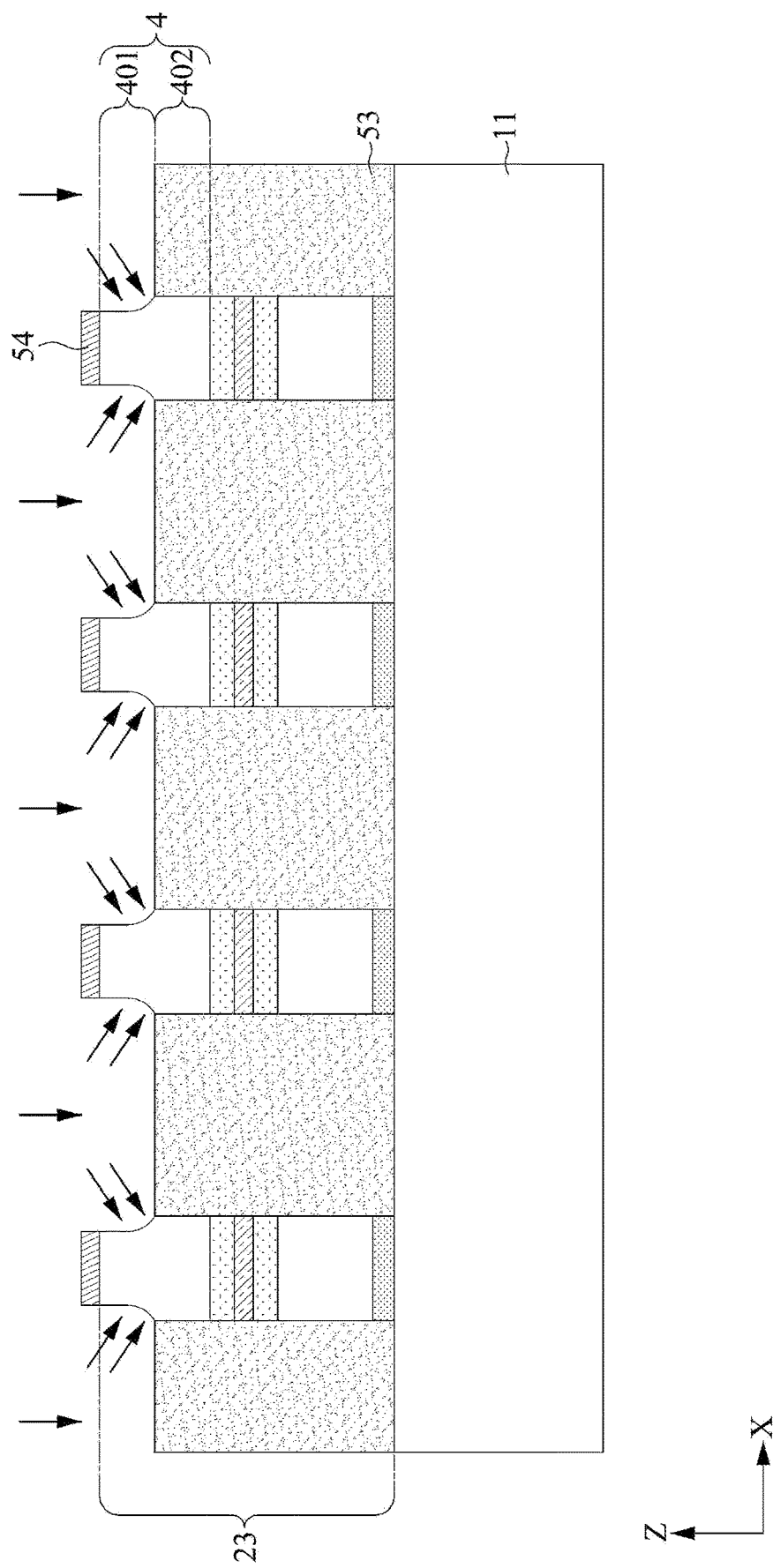

Referring to FIG. 6, a lateral etching operation is performed on the first portion 401 of the upper gate layer 4 in accordance with some embodiments of the present disclosure. In some embodiments, a wet etching operation is performed, and the wet etching is non-directional. In some embodiments, a dry etching operation is performed, and a bias power is controlled to increase a lateral etching effect of the plasma on the first portion 401 of the upper gate layer 4. In some embodiments, portions of the hard layer 54 are also removed by the lateral etching operation.

Figure 7:
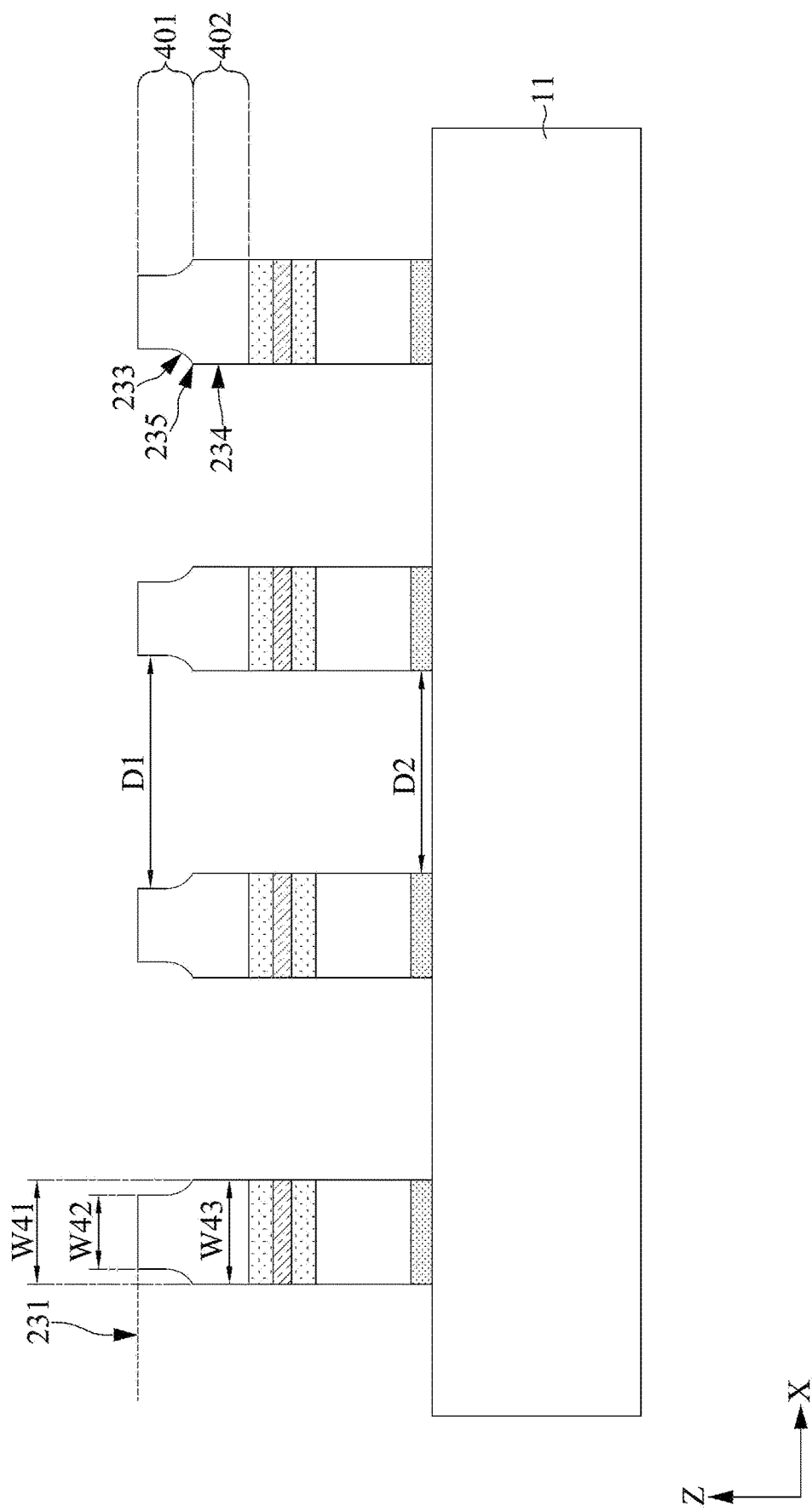

Referring to FIG. 7, the mask layer 53 shown in FIG. 6 is removed after the lateral etching operation in accordance with some embodiments of the present disclosure. In some embodiments that the mask layer 53 including a photoresist material, the mask layer 53 is removed by an ashing operation. In other embodiments that the mask layer 53 including a dielectric material, an etching operation having a selectivity to the dielectric material of the mask layer 53 is performed to remove the mask layer 53. In some embodiments, the hard layer 54 shown in FIG. 6 is removed prior to, concurrently with, or after the removal of the mask layer 53.

As a result of the lateral etching operation, the first portion 401 are laterally etched, and a width of the first portion 401 at the top surface 231 is reduced, wherein the width of the first portion 401 is measured along the first direction (horizontal direction or X direction). In some embodiments, a width W42 of the first portion 401 measured at the top surface 231 of the upper gate layer 4 after the lateral operation is reduced by 3% to 30% of a width W41 of the first portion 401 measured at the top surface 231 of the upper gate layer 4 prior to the lateral operation. In some embodiments, the width W42 of the first portion 401 measured after the lateral operation is less than a width W43 at a bottom surface of the upper gate layer 4 measured after the lateral operation by a range between 3% to 30% of the width W43 of the first portion 401. In some embodiments, the width W43 is substantially equal to the width W41. In some embodiments, the width W42 of the first portion is reduced by 1.5% to 15% on each of two opposite sides of the first portion 401 as illustrated in FIGS. 6 and 7. In other words, a lateral distance D1 between tops (or top surfaces 231) of two adjacent pillar structures 23 is substantially greater than a lateral distance D2 between bottoms (or bottom surfaces) of the two adjacent pillar structures 23 by a range of 3% to 30% of the width W41.

In addition, a corner 235 may be defined after the lateral etching operation. The sidewall 233 connects to the sidewall 234, and the corner 235 is formed at an intersection or a junction of a sidewall 233 of the first portion 401 and a sidewall 234 of the second portion 402. In some embodiments, the corner 235 is a sharp corner as shown in FIG. 7. A configuration of the sidewall 233 can be defined by the lateral etching operation. In some embodiments, the sidewall 233 is a curved sidewall. In some embodiments, the sidewall 233 is a concaved sidewall. In some embodiments, the sidewall 233 is substantially planar and has a slope different from a slope of the sidewall 234. In some embodiments, the sidewall 234 is a planar sidewall extending along the second direction (e.g., Z direction), wherein the configuration of the sidewall 234 is defined by the patterning operation as shown in FIG. 3. Due to different directions of the etching operations shown in FIG. 3 and FIG. 6, it results in different extending direction and/or configuration of the sidewalls 233 and 234, and therefore, the corner 235 is observable in the memory unit to be formed.

Figure 8:
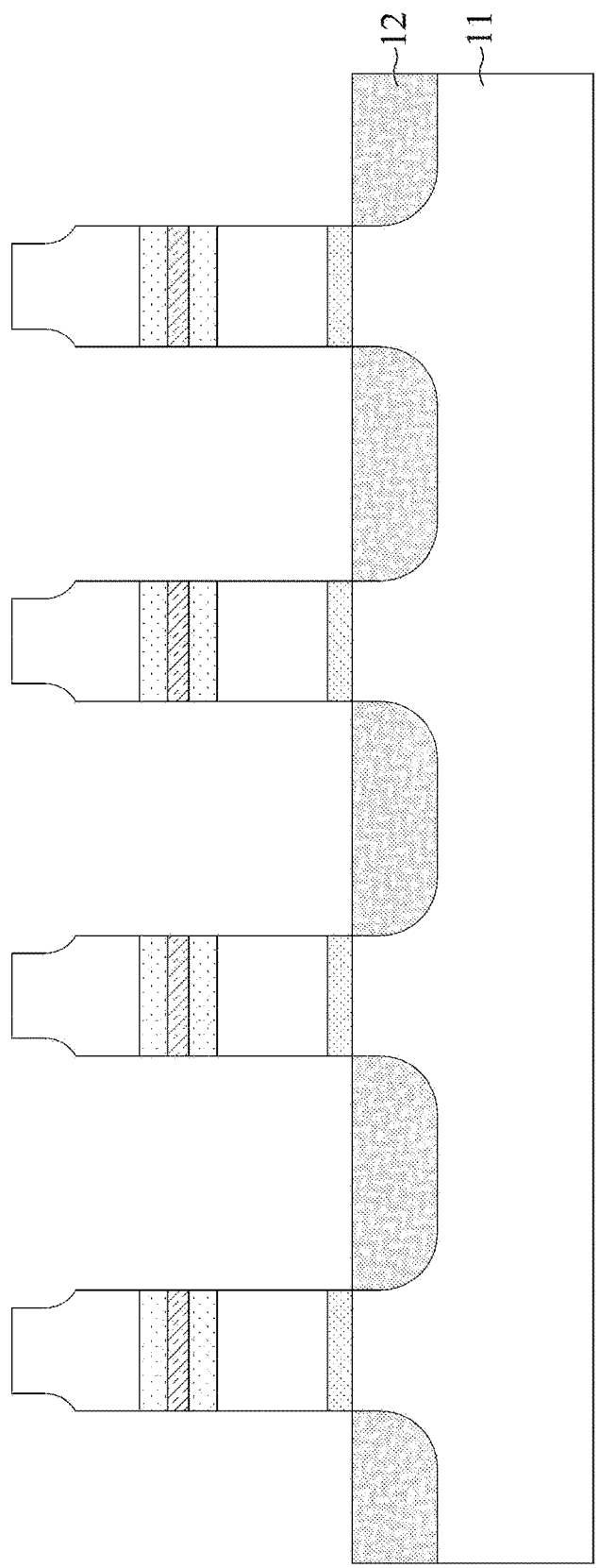

Referring to FIG. 8, a first implantation is performed to form a plurality of doping regions 12 in accordance with some embodiments of the present disclosure. A mask layer is optionally formed over the substrate 1 and the pillar structures 23 prior to the first implantation for a purpose of definition of positions or locations of the doping regions 12 in the substrate 1. In some embodiments, an entire ty of the doping regions 12 is formed in the active regions 11 of the substrate 1. In some embodiments, the doping regions 12 are referred to as light doping regions 12 due to a relatively low concentration of dopants compared to a doping region to be formed in each of the doping regions 12 in subsequent processing. A conductivity of the doping regions 12 can be a first type (e.g., P-type or N-type) or a second type (e.g., N-type or P-type) different from the first type depending on applications.

Figure 9:
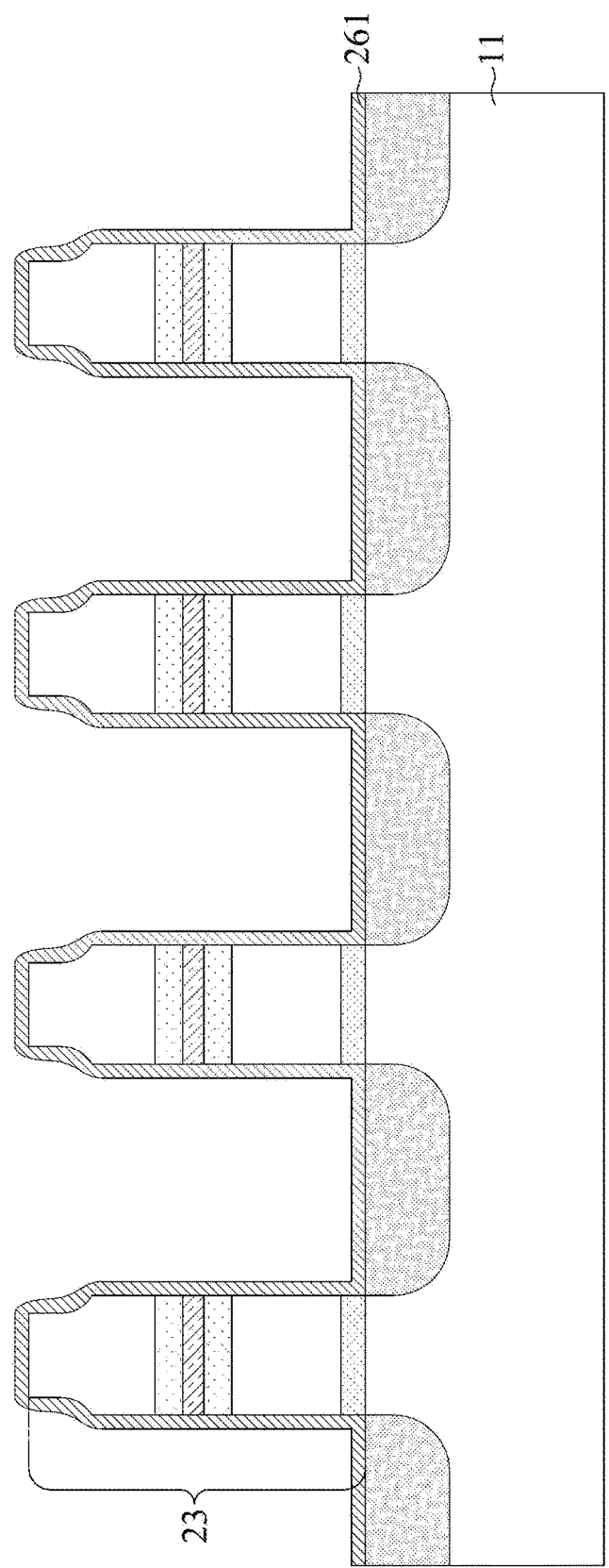

Referring to FIG. 9, a dielectric layer 261 is formed over and conformal to a profile of the pillar structures 23 and the substrate 1 in accordance with some embodiments of the present disclosure. In some embodiments, the dielectric layer 261 includes a dielectric material selected from the list of the materials of the dielectric layers 21 and 22 as illustrated above. In some embodiments, the dielectric layer 261 is silicon oxide. The dielectric layer 261 can be formed by a deposition, an oxidation, or a combination thereof. In some embodiments, a thickness of the dielectric layer 261 is substantially greater than a half of the difference between the width W41 and the width W42. In some embodiments, the dielectric layer 261 covers an entirety of the pillar structures 23.

Figure 10:
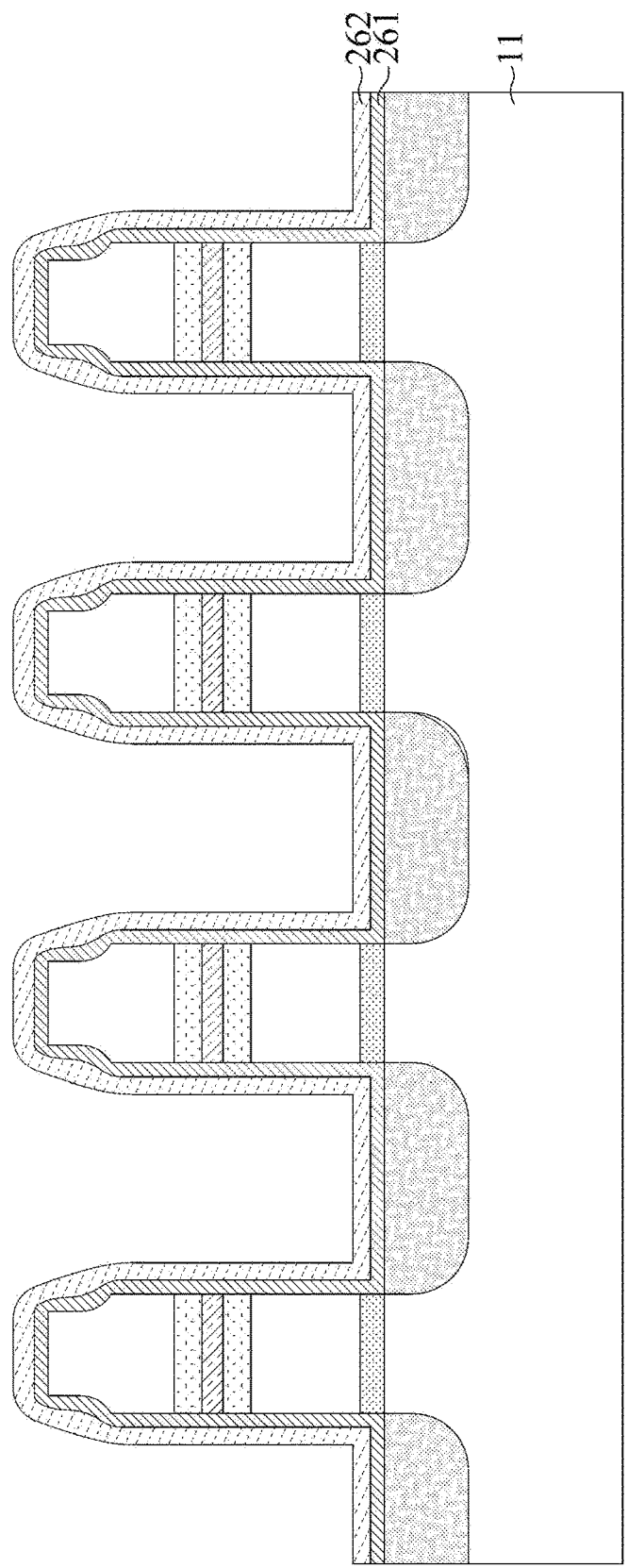

Referring to FIG. 10, a dielectric layer 262 is formed over and conformal to a profile of the dielectric layer 261 in accordance with some embodiments of the present disclosure. In some embodiments, the dielectric layer 261 includes a dielectric material selected from the list of the materials of the dielectric layers 21 and 22 as illustrated above. In some embodiments, the dielectric material of the dielectric layer 262 is different from that of the dielectric layer 261. In some embodiments, the dielectric layer 261 is silicon nitride. In some embodiments, a thickness of the dielectric layer 262 is substantially greater than the thickness of the dielectric layer 261. In some embodiments, the dielectric layer 262 covers an entirety of the dielectric layer 261.

Figure 11:
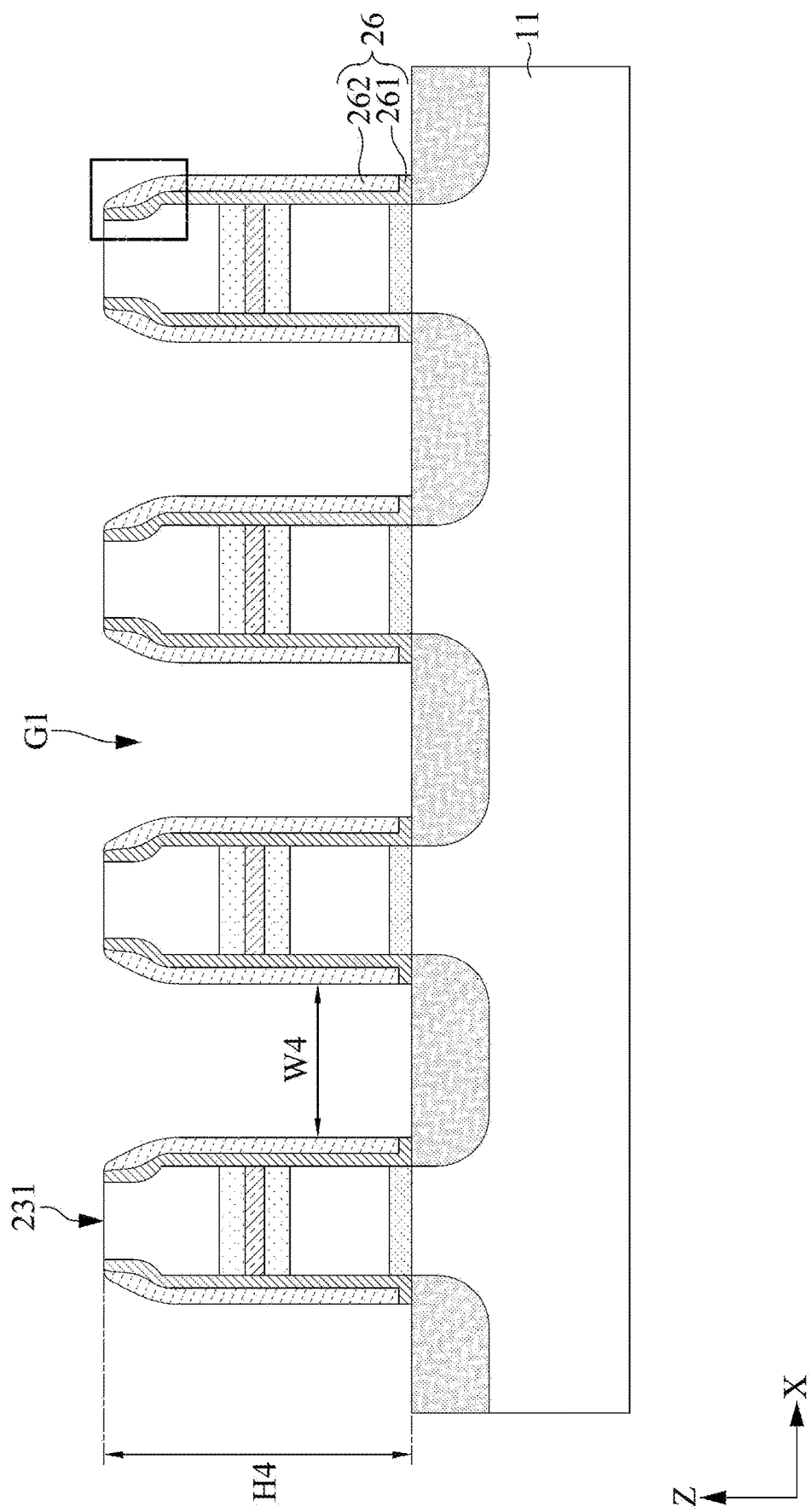

Referring to FIG. 11, a spacer etching operation is performed on the dielectric layers 261 and 262, thereby forming a spacer structure 26 surrounding each of the pillar structures 23 in accordance with some embodiments of the present disclosure. In some embodiments, the spacer structure 26 is considered as a spacer of the pillar structure 23, and the top surfaces 231 of the pillar structures 26 are exposed. In some embodiments, horizontal portions of the dielectric layers 261 and 262 are removed. In some embodiments, the spacer etching operation includes a dry etching operation to remove the dielectric layers 261 and 262 concurrently. The spacer structure 26 can include at least the dielectric layers 261 and 262. It should be noted that the spacer structure 26 is a multi-layer structure and can include two or more layers of dielectric materials. The spacer structure 26 including two dielectric layers (i.e., the dielectric layers 261 and 262) is an exemplary embodiment for a purpose of illustration, but the present disclosure is not limited herein. In some embodiments, portions of the substrate 1 between the spacer structures 26 of adjacent pillar structures 23 are exposed by the spacer etching operation. In some embodiments, a portion of each of the doping regions 12 is exposed through the spacer structures 26.

A gap (or a space) G1 is defined between adjacent spacer structures 26 as shown in FIG. 11. In some embodiments, an aspect ratio of the gap or the space is substantially equal to or greater than 4.3. In some embodiments, the aspect ratio is a ratio of a height H4 of the gap to a distance W4 of the adjacent spacer structures 26. In some embodiments, the height H4 is referred to as a height H4 of the pillar structures 26 since the height of the gap is defined by the height of the pillar structure 26. The gap G1 includes a wider top due to the lateral etching operation on the first portion 401 and the presence of the sidewall 233.

Figure 12:
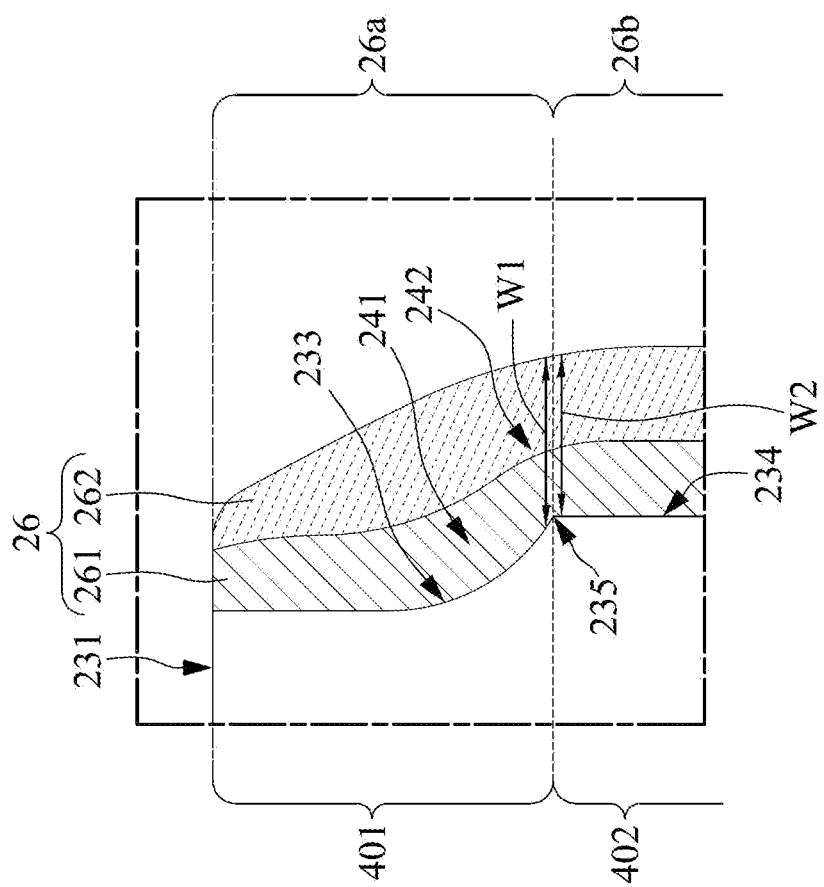
FIG. 12 is an enlarged diagram of a portion of a semiconductor structure show in FIG. 11 in accordance with some embodiments of the disclosure.

FIG. 12 is an enlarged diagram of a region of the intermediate structure indicated in a rectangular line shown in FIG. 11 in accordance with some embodiments of the present disclosure. As illustrated above, in some embodiments, the sidewall 233 is a concaved sidewall. In some embodiments, the sidewall 234 is a planar sidewall extending along a vertical direction, and the sharp corner 235 is defined as a connection of the sidewall 233 and the sidewall 234. In some embodiments, the dielectric layer 261 includes a first convex portion 241 protruding toward the sidewall 233. In some embodiments, the dielectric layer 261 further includes a second convex portion 242 protruding away from the corner 235. Thicknesses of the spacer structure 26 at elevations above and below an elevation of the corner 235 can be different.

The elevation of the corner 235 is indicated in a dotted line in FIG. 12. For a purpose of illustration, a portion of the spacer structure 26 above the dotted line is referred to as an upper portion 26a, and a portion of the spacer structure 26 is referred to as a lower portion 26b. In some embodiments, the upper portion 26a of the spacer structure 26 surrounds the first portion 401 of the upper gate layer 4, and the lower portion 26b of the spacer structure 26 surrounds the second portion 402 and a remaining portion of the pillar structure 23 disposed there-below. In some embodiments, the dotted line indicates a junction (or a connecting surface) of the upper portion and the lower portion of the spacer structure 26. Due to the lateral etching operation and the presence of the sidewall 233, a width W1 of the upper portion 26a is substantially greater than a width W2 of the lower portion 26b. In some embodiments, the width W1 and the width W2 are measured along the first direction (e.g., X direction) proximal to the junction (or the connecting surface) of the upper portion 26a and the lower portion 26b respectively.

Figure 13:
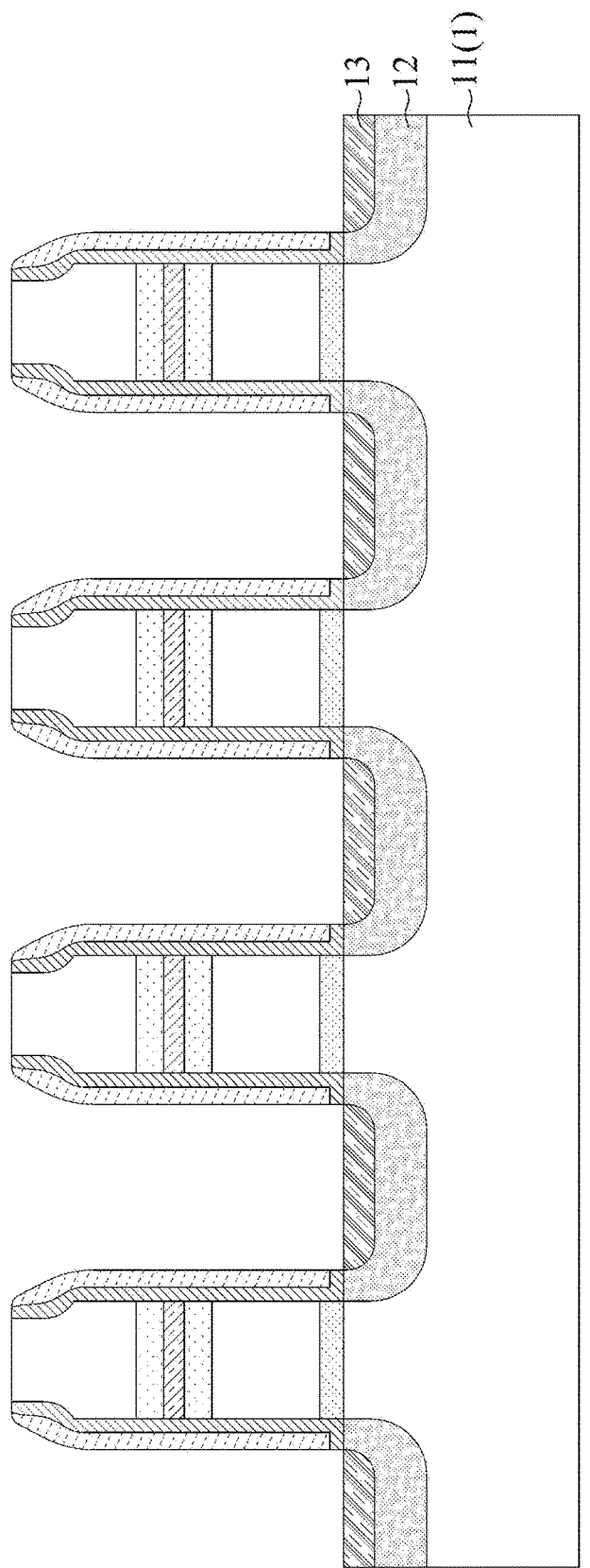

Referring to FIG. 13, a second implantation is performed to form a plurality of doping regions 13 in accordance with some embodiments of the present disclosure. The plurality of doping regions 13 are formed in exposed portions of the substrate 1. In some embodiments, an entirety of the doping regions 13 is formed in the doping regions 12 in the active regions 11 of the substrate 1. In some embodiments, the doping regions 13 are referred to as heavy doping regions 13 due to a relatively high concentration of dopants compared to the doping regions 12. A conductivity of the doping regions 13 can be the first type (e.g., P-type or N-type) or the second type (e.g., N-type or P-type) according to the type of conductivity of the doping regions 12.

Figure 14:
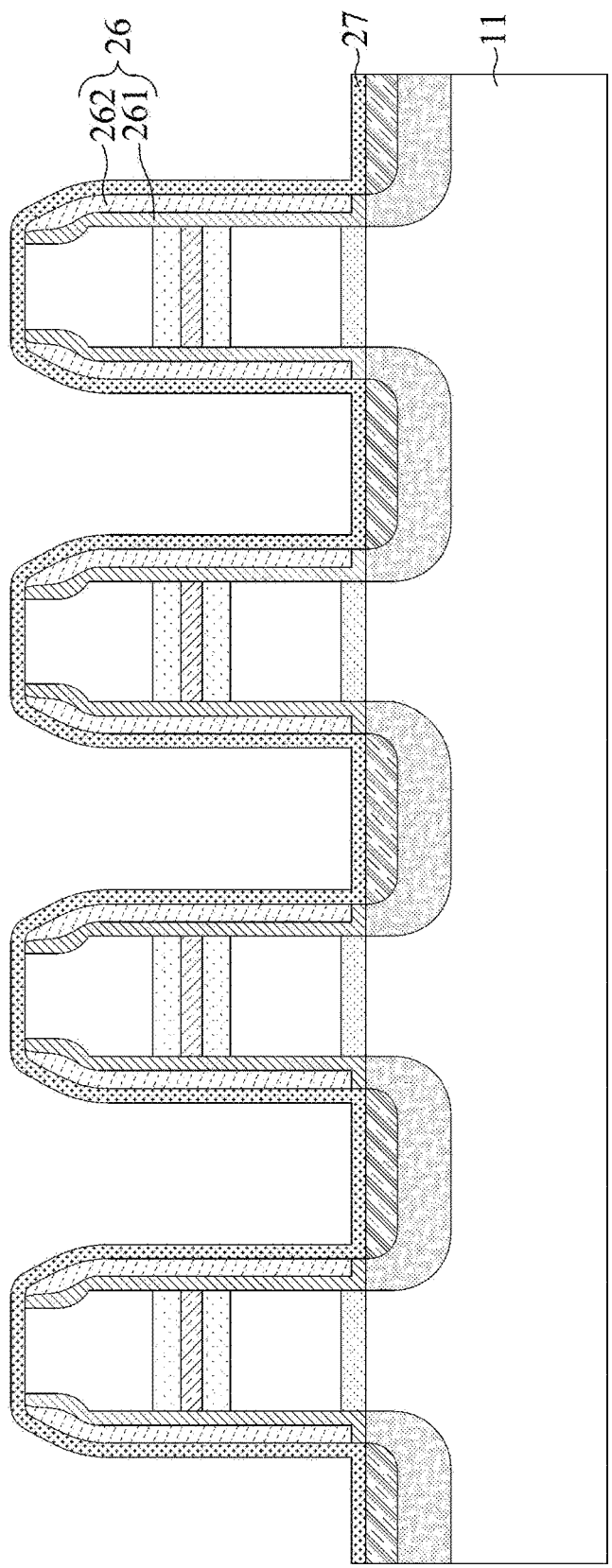

Referring to FIG. 14, a etch stop layer 27 is formed over the substrate 1 in accordance with some embodiments of the present disclosure. In some embodiments, the etch stop layer 27 is conformal to a profile of the pillar structures 23 and the spacer structures 26. The etch stop layer 27 can include one or more dielectric materials. In some embodiments, the etch stop layer 27 includes a dielectric material selected from the list of the materials of the dielectric layers 21 and 22 as illustrated above. In some embodiments the etch stop layer 27 includes nitride. The etch stop layer 27 may cover an entirety of the pillar structures 23, the spacer structures 26 and the substrate 1 at this stage.

Figure 15:
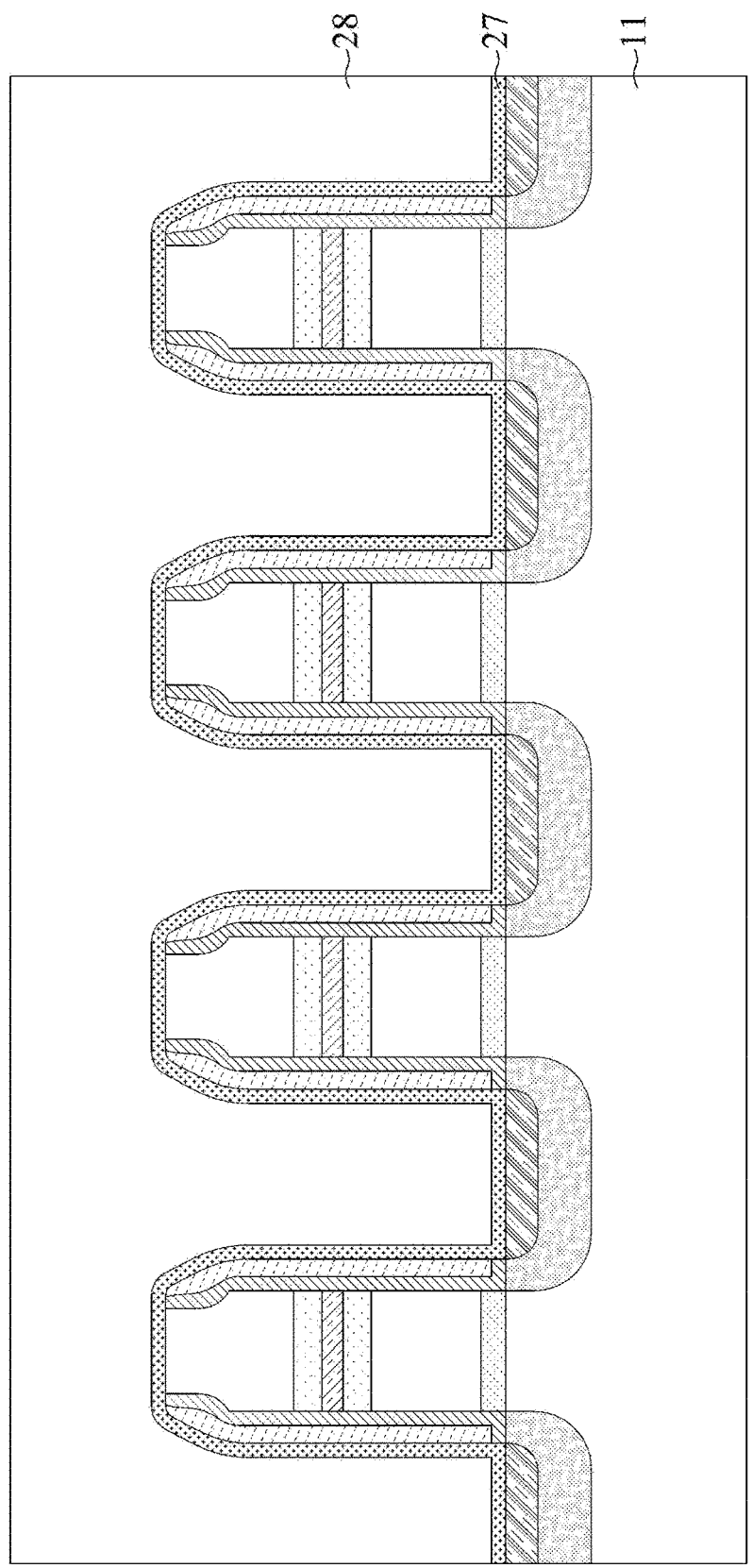

Referring to FIG. 15, an inter-layer dielectric (ILD) layer 28 is formed over the substrate 1 in accordance with some embodiments of the present disclosure. In some embodiment, a blanket deposition is performed followed by a planarization to form the ILD layer 28 shown in FIG. 15. The ILD layer 28 completely fills the gaps (or the spaces) G1 between the spacer structures 26 due to an enlarged width at an opening of the gap G1 (i.e., enlarged distance D1 at the top surfaces 231 of adjacent pillar structures 23) shown in FIG. 11.

Figure 16:
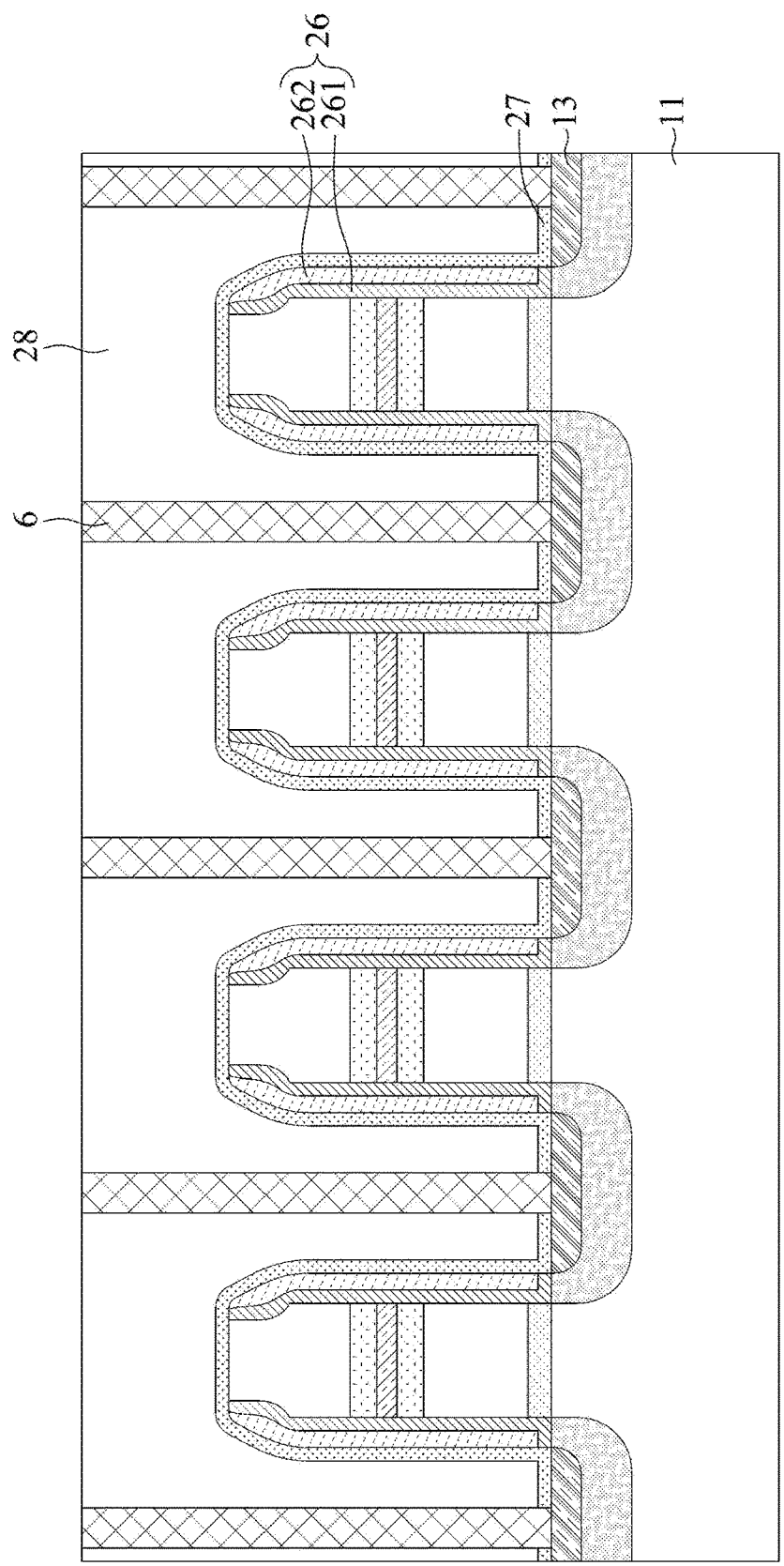

Referring to FIG. 16, a plurality of contact plugs 6 is formed in the ILD layer 28 in accordance with some embodiments of the present disclosure. In some embodiments, portions of the ILD layer 28 are removed, e.g., by a dry etching operation. In some embodiments, portions of the etch stop layer 27 are also removed. The etch stop layer 27 is for a purpose of detection of a termination of the dry etching operation of the removal of the portions of ILD layer 28. In some embodiments, the etch stop layer 27 are partially removed by the dry etching operation concurrently with the removal of the portions of the ILD layer 28. In some embodiments, the dry etching operation stops on the etch stop layer 27. In some embodiments, the portions of the etch stop layer 27 are removed by another etching operation after the removal of the portions of the ILD layer 28. In some embodiments, portions of the substrate 1 between the spacer structures 26 are exposed. In some embodiments, the doping regions 13 are exposed. In some embodiments, a conductive material fills the openings of the ILD layer 28, thereby forming the contact plugs 6 as shown in FIG. 15. The contact plugs 6 are for a purpose of electrical connection of the doping regions 13. A semiconductor structure is thereby formed.

Figure 17:
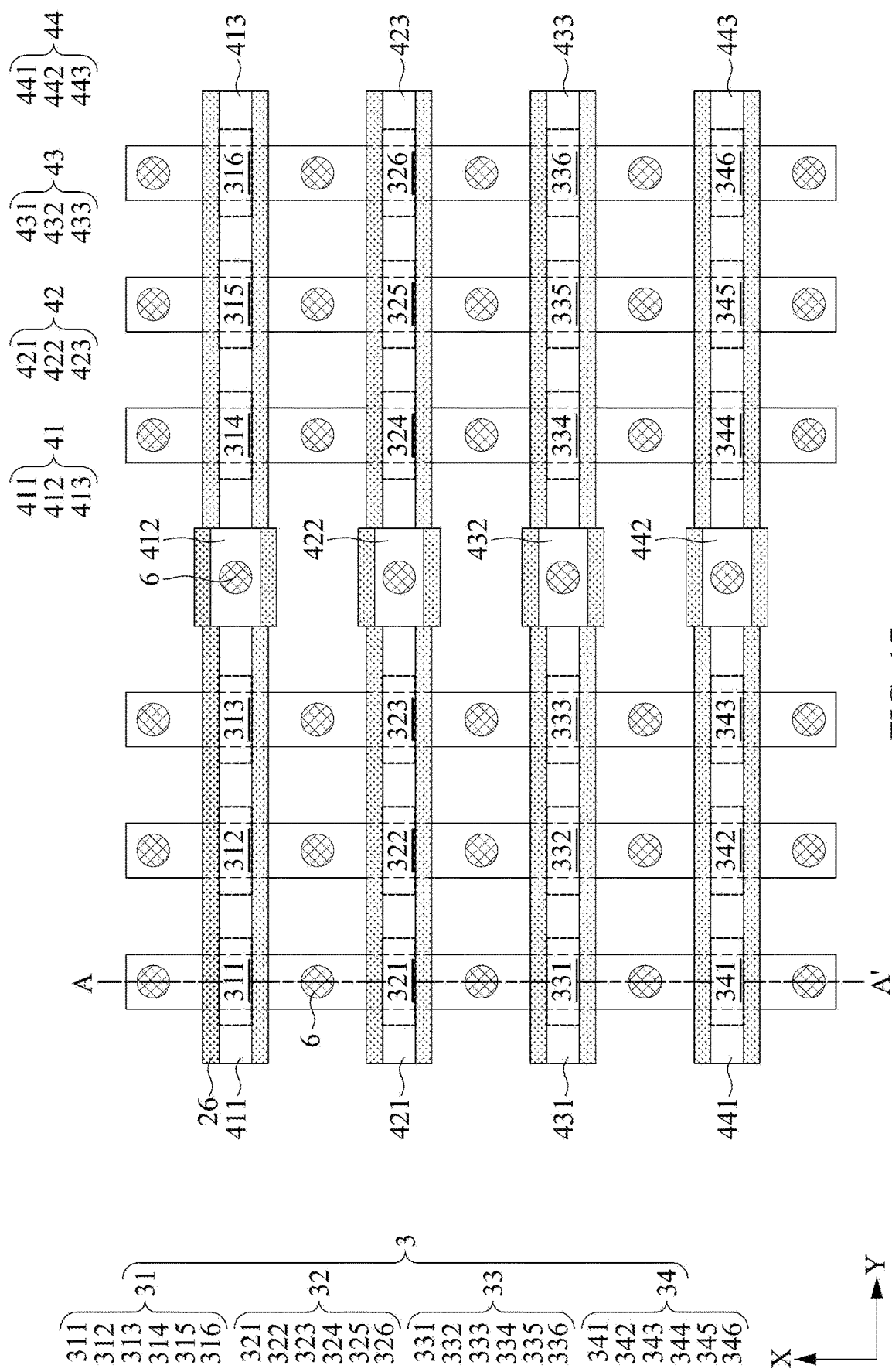
FIG. 17 is a schematic top-view perspective of a semiconductor structure in accordance with some embodiments of the disclosure.

FIG. 17 is a schematic top-view perspective of the semiconductor structure shown in FIG. 16. In some embodiments, the cross-sectional diagrams shown in FIGS. 1 to 16 are along a line A-A' shown in FIG. 17 at different stages of the method of manufacturing the semiconductor structure. In some embodiments, each of the segments 41, 42, 43, and 44 of the upper gate layer 4 includes three portions (e.g., 411 to 413, 421 to 423, 431 to 433, and 441 to 443) connecting along a third direction (e.g., Y direction). In some embodiments, the middle portion (e.g., 412, 422, 432, or 442) of the three portions of a segment 41, 42, 43 or 44 has a width substantially greater than a width of the other two portions for a purpose of alignment with a contact plug 6, wherein the widths of the three portions are measured along the first direction (or X direction).

In some embodiments, the lower gate layer 3 is patterned into portions arranged along the third direction (e.g., Y direction) prior to the formation of the dielectric layer 22 shown in FIG. 1, wherein the third direction is substantially orthogonal to the first direction or the second direction. In some embodiments, each of the segments 31, 32, 33 and 34 includes six portions (e.g., 311 to 316, 321 to 326, 331 to 336, and 341 to 346) arranged along the third direction. In some embodiments, three (e.g., 311 to 313, 321 to 323, 331 to 333, or 341 to 343) of six portions of a segment 31, 32, 33 or 34 of the lower gate layer 3 are overlapped by the portion 411, 412, 413 or 414 of the upper gate layer 4. In some embodiments, the other three (e.g., 314 to 316, 324 to 326, 334 to 336, or 344 to 346) of the six portions of the segment 31, 32, 33 or 34 are overlapped by the portion 413, 413, 413 or 413 of the upper gate layer 4. In some embodiments, each of the active areas 11 extends along the first direction and is overlapped by portions of different segments of the lower gate layer 4 lined along the first direction.

To conclude the operations as illustrated in FIGS. 1 to 16 and 17 above, a method 700 and a method 800 within a same concept of the present disclosure are provided.

Figure 18:
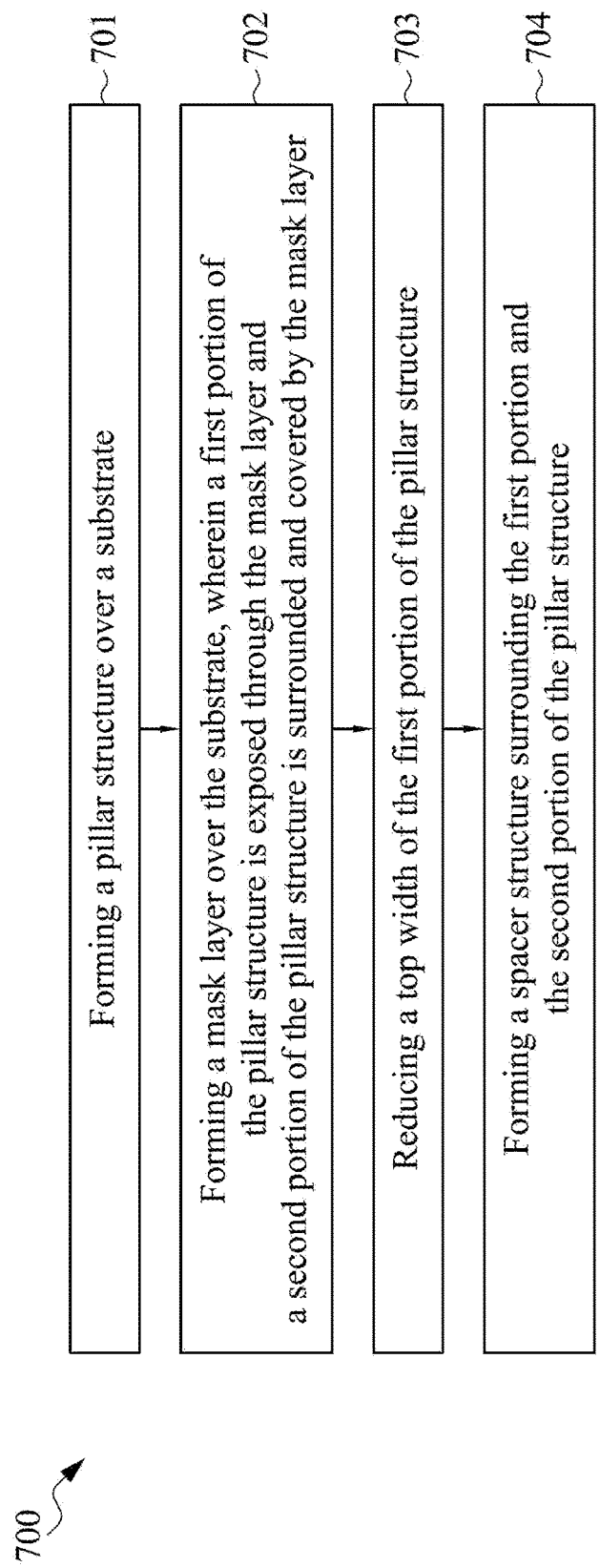
FIG. 18 is a flow diagram of a method for manufacturing a semiconductor structure in accordance with some embodiments of the disclosure.

FIG. 18 is a flow diagram of the method 700 for manufacturing a semiconductor structure in accordance with some embodiments of the present disclosure. The method 700 includes a number of operations (701, 702, 703 and 704) and the description and illustration are not deemed as a limitation to the sequence of the operations. In the operation 701, a pillar structure is formed over a substrate. In the operation 702, a mask layer is formed over the substrate, wherein a first portion of the pillar structure is exposed through the mask layer and a second portion of the pillar structure is surrounded and covered by the mask layer. In the operation 703, a top width of the first portion of the pillar structure is reduced. In the operation 704, a spacer structure surrounding the first portion and the second portion of the pillar structure is formed.

Figure 19:
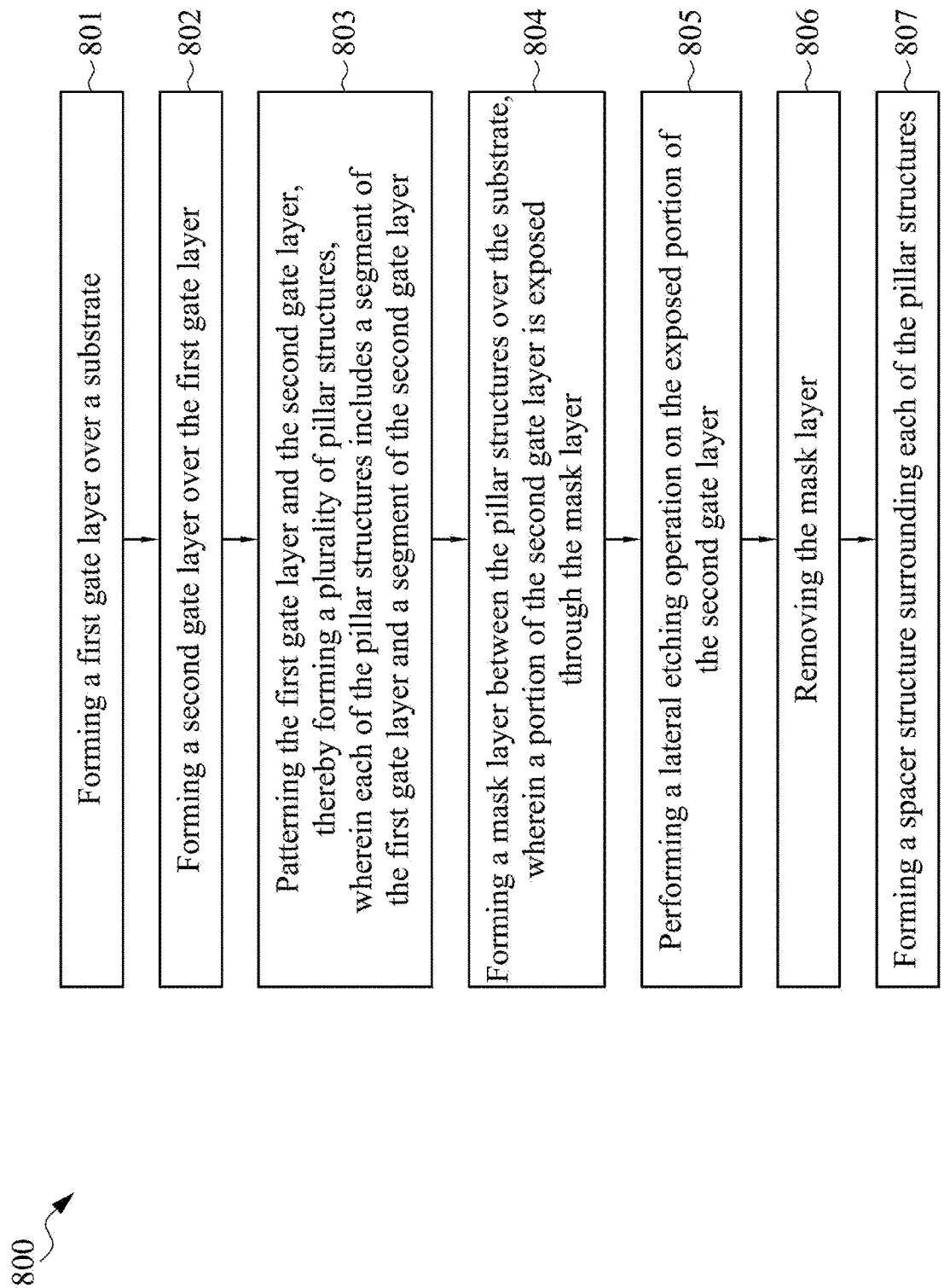
FIG. 19 is a flow diagram of a method for manufacturing a semiconductor structure in accordance with some embodiments of the disclosure.

FIG. 19 is a flow diagram of the method 800 for manufacturing a semiconductor structure in accordance with some embodiments of the present disclosure. The method 800 includes a number of operations (801, 802, 803, 804, 805, 806 and 807) and the description and illustration are not deemed as a limitation to the sequence of the operations. In the operation 801, a first gate layer is formed over a substrate. In the operation 802, a second gate layer is formed over the first gate layer. In the operation 803, the first gate layer and the second gate layer are patterned, thereby forming a plurality of pillar structures, wherein each of the pillar structures includes a segment of the first gate layer and a segment of the second gate layer. In the operation 804, a mask layer is formed between the pillar structures over the substrate, wherein a portion of the second gate layer is exposed through the mask layer. In the operation 805, a lateral etching operation is performed on the exposed portion of the second gate layer. In the operation 806, the mask layer is removed. In the operation 807, a spacer structure is formed surrounding each of the pillar structures.

It should be noted that the operations of the method 700 and/or the method 800 may be rearranged or otherwise modified within the scope of the various aspects. Additional processes may be provided before, during, and after the method 700 and/or the method 800, and some other processes may be only briefly described herein. Thus, other implementations are possible within the scope of the various aspects described herein.

In accordance with some embodiments of the disclosure, a semiconductor structure is provided. The semiconductor structure includes a pillar structure and a spacer structure. The pillar structure is disposed over a substrate, and comprises: a lower layer, disposed on the substrate; an upper layer, disposed over the lower layer; and a dielectric layer, disposed between the lower layer and the upper layer, wherein the upper layer includes a first portion and a second portion disposed below and connecting the first portion. The spacer structure laterally surrounds the pillar structure, and comprises: an upper portion, surrounding the first portion of the upper layer; and a lower portion, disposed below and connecting the upper portion, wherein a first thickness of the upper portion is substantially greater than a second thickness of the lower portion.

In accordance with some embodiments of the disclosure, a method for manufacturing a semiconductor structure is provided. The method may include several operations. A pillar structure is formed over a substrate. A mask layer is formed over the substrate, wherein a first portion of the pillar structure is exposed through the mask layer and a second portion of the pillar structure is surrounded and covered by the mask layer. A top width of the first portion of the pillar structure is reduced. A spacer structure surrounding the first portion and the second portion of the pillar structure is formed.

In accordance with some embodiments of the disclosure, a method for manufacturing a semiconductor structure is provided. The method may include several operations. A first gate layer is formed over a substrate. A second gate layer is formed over the first gate layer. The first gate layer and the second gate layer are patterned, thereby forming a plurality of pillar structures, wherein each of the pillar structures includes a segment of the first gate layer and a segment of the second gate layer. A mask layer is formed between the pillar structures over the substrate, wherein a portion of the second gate layer is exposed through the mask layer. A lateral etching operation is performed on the exposed portion of the second gate layer. The mask layer is removed. A spacer structure is formed surrounding each of the pillar structures.

The foregoing outlines features of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method of manufacturing a semiconductor structure, comprising:
   forming a pillar structure over a substrate;

forming a mask layer over the substrate, wherein a first portion of the pillar structure is exposed through the mask layer and a second portion of the pillar structure is surrounded and covered by the mask layer;

reducing a top width of the first portion of the pillar structure; and forming a spacer structure surrounding the first portion and the second portion of the pillar structure.

2. The method of claim 1, wherein the formation of the mask layer comprises:

forming a material layer covering the pillar structure; and removing a portion of the material layer to expose the first portion of the pillar structure, thereby forming the mask layer.

3. The method of claim 1, wherein the reduction of the top width of the first portion of the pillar structure comprises:

performing a dry etching operation targeting the first portion of the pillar structure.

4. The method of claim 1, wherein the mask layer includes a photoresist material, and the mask layer is removed by an ashing operation after the reduction of the top width of the first portion of the pillar structure.

5. The method of claim 1, wherein the formation of the spacer structure comprises:

forming a first dielectric layer over the pillar structure;

forming a second dielectric layer over the first dielectric layer; and performing a spacer etching operation to remove a portion of the second dielectric layer and a portion of the first dielectric layer.

6. The method of claim 1, wherein the forming of the pillar structure further comprising:

forming a first dielectric layer over the substrate;

forming a first semiconductive material layer over the first dielectric layer;

forming a second dielectric layer over the first semiconductor layer;

forming a second semiconductive material layer over the second dielectric layer; and patterning the first dielectric layer, the first semiconductive material layer, the second dielectric layer and the second semiconductive material layer to form the pillar structure.

7. The method of claim 6, wherein the second dielectric layer comprises an oxide-nitride-oxide layer.

8. The method of claim 6, wherein a vertical distance between a top surface of the mask layer is and a top surface of the pillar structure is between 50% and 90% of a thickness of the second semiconductive material layer of the pillar structure.

9. A method of manufacturing a semiconductor structure, comprising:

forming a first gate layer over a substrate;

forming a second gate layer over the first gate layer;

patterning the first gate layer and the second gate layer, thereby forming a plurality of pillar structures, wherein each of the pillar structures includes a segment of the first gate layer and a segment of the second gate layer;

forming a mask layer between the pillar structures over the substrate, wherein a portion of the second gate layer is exposed through the mask layer;

performing a lateral etching operation on the exposed portion of the second gate layer;

removing the mask layer; and forming a spacer structure surrounding each of the pillar structures.

10. The method of claim 9, wherein the spacer structure includes a plurality of spacers surrounding the plurality of pillar structures respectively, an aspect ratio of a space between adjacent spacers from a cross section is substantially equal to or greater than 4.3, and the aspect ratio is equal a height of the pillar structures to a distance of the adjacent spacers.

11. The method of claim 9, further comprising:

performing a first implantation on the substrate after the removal of the mask layer, thereby forming a plurality of first doping regions; and performing a second implantation on the substrate after the formation of the spacer structure, thereby forming a plurality of second doping regions in the plurality of first doping regions.

12. The method of claim 11, further comprising:

forming a dielectric structure over the substrate; and forming a plurality of contact plugs in the dielectric structure electrically connecting the plurality of second doping regions.

13. A method of manufacturing a semiconductor structure, comprising:

forming a pillar structure over a substrate, wherein the pillar structure comprises a lower layer and an upper layer;

removing a portion of the upper layer of the pillar structure to form a first portion and a second portion, wherein a width of the first portion of the upper layer is less than a width of the second portion of the upper layer, wherein the removing of the portion of the upper layer of the pillar structure to form the first portion and the second portion further comprises:

forming a material layer covering the pillar structure, wherein the a top surface of the material layer is lower than a top surface of the upper layer of the pillar structure; and performing a lateral etching operation to remove the portion of the upper layer of the pillar structure; and forming a spacer structure over sidewalls of the pillar structure, wherein the spacer structure has a first portion and a second portion, and a width of the first portion of the spacer structure is greater than a width of the second portion of the spacer structure, wherein the first portion of the spacer structure is coupled to the first portion of the upper layer of the pillar structure, and the second portion of the spacer structure is coupled to the second portion of the upper layer of the pillar structure.

14. The method of claim 13, wherein a width of the lower layer of the pillar structure is equal to the width of the second portion of the upper layer of the pillar structure.

15. The method of claim 13, further comprising forming a doping region in the substrate prior to the forming of the spacer structure.

16. The method of claim 13, further comprising forming a doping region in the substrate after the forming of the spacer structure.

17. The method of claim 13, wherein the formation of the spacer structure comprises:

forming a first dielectric layer over the pillar structure and the substrate;

forming a second dielectric layer over the first dielectric layer; and removing a portion of the second dielectric layer and a portion of the first dielectric layer.

18. The method of claim 13, wherein the upper layer of the pillar structure and the lower layer of the pillar structure are separated from each other by a dielectric layer.

19. The method of claim 13, further comprising forming an etch stop layer and an inter-layer dielectric over substrate, the pillar structure and the spacer structure.

20. The method of claim 19, further comprising forming a contact plug in the inter-layer dielectric.

* * * * *